US012578370B2

(12) United States Patent
Majkic et al.

(10) Patent No.: US 12,578,370 B2
(45) Date of Patent: Mar. 17, 2026

(54) QUENCH DETECTION IN SUPERCONDUCTORS

(71) Applicant: UNIVERSITY OF HOUSTON SYSTEM, Houston, TX (US)

(72) Inventors: Goran Majkic, Houston, TX (US); Venkat Selvamanickam, Houston, TX (US); Jarek Wosik, Houston, TX (US)

(73) Assignee: University of Houston System, Houston, TX (US)

( * ) Notice: Subject to any disclaimer, the term of this patent is extended or adjusted under 35 U.S.C. 154(b) by 338 days.

(21) Appl. No.: 18/141,390

(22) Filed: Apr. 29, 2023

(65) Prior Publication Data

US 2023/0384356 A1    Nov. 30, 2023

Related U.S. Application Data

(63) Continuation of application No. 17/827,663, filed on May 28, 2022, now abandoned.

(51) Int. Cl.
*G01R 23/02* (2006.01)
*H01P 3/08* (2006.01)
*H10N 60/85* (2023.01)

(52) U.S. Cl.
CPC .............. *G01R 23/02* (2013.01); *H01P 3/081* (2013.01); *H10N 60/857* (2023.02)

(58) Field of Classification Search
CPC ........ G01R 23/02; H01P 3/081; H10N 60/857
See application file for complete search history.

(56) References Cited

U.S. PATENT DOCUMENTS

| | | | | | |
|---|---|---|---|---|---|
| 5,900,618 | A | * | 5/1999 | Anlage .................. | B82Y 20/00 |
| | | | | | 250/201.3 |
| 2012/0044603 | A1 | | 2/2012 | Dommerque et al. | |
| 2014/0235451 | A1 | | 8/2014 | Uglietti et al. | |
| 2017/0179364 | A1 | * | 6/2017 | Schwartz .............. | H10N 60/80 |
| 2019/0122796 | A1 | * | 4/2019 | Noyes ..................... | H02H 7/001 |
| 2021/0208011 | A1 | * | 7/2021 | Takayasu .............. | H02H 7/001 |
| 2022/0291049 | A1 | * | 9/2022 | Yang ..................... | H10N 60/30 |

FOREIGN PATENT DOCUMENTS

| | | | | |
|---|---|---|---|---|
| CN | 106706669 A | 5/2017 | | |
| WO | WO-2013035669 A1 | * | 3/2013 | ............... H01F 6/02 |
| WO | WO-2021180146 A1 | * | 9/2021 | ............... H01F 6/00 |

OTHER PUBLICATIONS

International Search Report for PCT/US2022/031473, Mailed on Feb. 22, 2023.
Takayusa et al., Investigation of Twisted Stacked-Tape Cable Conductor, Oct. 18, 2011 (retrieved from the internet).

* cited by examiner

*Primary Examiner* — Akm Zakaria
(74) *Attorney, Agent, or Firm* — Robert A. Voigt; Shackelford, McKinley & Norton, LLP

(57) ABSTRACT

A method and system for quench detection in high temperature superconductors, such as REBCO (rare-earth barium copper oxide), before thermal runaway. A REBCO superconducting tape is excited as a transmission line forming standing waves. A quench may then be detected in response to detecting a disturbance of the standing waves. In this manner, quench in high temperature superconductors, such as REBCO, is rapidly detected before thermal runaway.

28 Claims, 4 Drawing Sheets

QUENCH DETECTION IN SUPERCONDUCTORS

GOVERNMENT INTERESTS

This invention was made with government support under Grant Number N00014-21-1-2429 awarded by the Office of Naval Research. The U.S. government has certain rights in the invention.

TECHNICAL FIELD

The present disclosure relates generally to superconductors, and more particularly to detecting quench in high temperature superconductors (e.g., REBCO (rare-earth barium copper oxide)).

BACKGROUND

Superconductivity is a set of physical properties observed in certain materials where electrical resistance vanishes and magnetic flux fields are expelled from the material. Any material exhibiting these properties is a superconductor.

A superconducting material will behave as a superconductor in a region defined by the critical temperature of the superconductor (the highest temperature at which the material is a superconductor in zero applied magnetic field) and the critical field of the superconductor (the highest magnetic field in which the material is a superconductor at OK). The temperature of the superconductor and the magnetic field present limit the current which can be carried by the superconductor without the superconductor becoming resistive or "normal." "Normal," as used herein, refers to "not superconducting."

Superconducting materials are typically divided into "high temperature superconductors" (HTS) and "low temperature superconductors" (LTS). LTS materials, such as Nb and NbTi, are metals or metal alloys whose superconductivity can be described by the Bardeen-Cooper-Schrieffer (BCS) theory. All low temperature superconductors have a critical temperature (the temperature above which the material cannot be superconducting even in a zero magnetic field) below about 30K. The behavior of HTS materials though is not described by the BCS theory, and such materials may have critical temperatures above about 30K (though it should be noted that it is the physical differences in superconducting operation and composition, rather than the critical temperature, which define HTS materials). The most commonly used HTS are "cuprate superconductors," which correspond to ceramics based on cuprates (compounds containing a copper oxide group), such as bismuth strontium calcium copper oxide (BSCCO) or rare-earth element barium copper oxide (REBCO), where examples of the rare earth element may be Y or Gd. Other high temperature superconductors include iron pnictides (e.g., FeAs and FeSe) and magnesium diborate ($MgB_2$).

Among all superconductors, REBCO exhibits the best performance over a wide range of temperatures and in high magnetic fields. Due to their stronger magnetic field and relatively high superconducting critical temperature, these materials have been proposed for future magnetic confinement fusion reactors, such as the affordable, robust, compact (ARC) fusion reactor, allowing a more compact and economical construction, and for new generation magnets to use at particle accelerators, such as the Large Hadron Collider (LHC) at CERN.

Any rare-earth element may be used in REBCO. Some popular choices include yttrium (YBCO), dysprosium (DyBCO), samarium (Sm123), neodymium (Nd123), gadolinium (Gd123) and europium (Eu123), where the numbers among parenthesis indicate the molar ratio among rare-earth, barium and copper.

Because these types of materials are brittle, it was difficult to create wires from them. After 2005, industrial manufacturers started to produce tapes with different layers encapsulating the REBCO material and opening the way to commercial uses. For example, REBCO tapes may be fabricated using a reel-to-reel process where the superconductor is coated as a thin film over a flexible metal substrate with intervening dielectric buffer layers.

The superior current densities of REBCO tapes enable high power density and highly-efficient electric machines. At such high current densities, the superconductor is susceptible to localized heating at defective spots ("hot spots") that are invariably present in a long tape. Since each tape turn of coils that includes a superconducting device is typically insulated, the hot spots do not dissipate easily which causes a thermal runaway (process that is accelerated by increased temperature, which in turn, releases energy that further increases temperature), leading to a catastrophic failure (termination of operation in the resistive normal state). Such localized heat deposition leading to thermal runaway may be referred to as "quench." That is, quench refers to the abnormal termination of operation that occurs during the transition of superconductors from a superconducting state to a resistive normal state. Hence, the quench or normal zone (i.e., the hot spot) needs to be detected rapidly to protect the superconducting device.

In particular, thermal runaway, which leads to catastrophic failure in HTS materials, such as REBCO, is caused by the normal zone propagation (NZP) velocity being low (e.g., 0.01-0.1 m/s). By having such a low NZP velocity, the normal zone slowly spreads and thus slowly increases a fault-induced voltage. Simultaneously, the slow spread of heat results in high temperatures before the voltage increases sufficiently for external detection. These two combined effects may result in thermal runaway and catastrophic failure of the coil before quench detection.

Currently, several methods are being developed for quench detection, including modifications to the HTS coil designs for quench tolerance. These include acoustic emission detection, acoustic thermometry, Rayleigh scattering-based fiber optics, various quench antennas, ultrasonic wave-based detection, varying laminations, no-insulation coils, different insulation materials and epoxies. However, each solution has drawbacks, such as susceptibility to vibrations, low signal-to-noise ratio, extrinsic sensors co-wound with the tape that increase the complexity of coil fabrication or a reduction in the overall current density.

As a result, there is not currently a means for rapid quench detection in high temperature superconductors, such as REBCO, before thermal runaway.

SUMMARY

In one embodiment of the present disclosure, a method for quench detection in superconductors comprises exciting a REBCO (rare-earth barium copper oxide) superconducting tape as a transmission line forming standing waves. The method further comprises detecting a quench in response to detecting a disturbance of the standing waves.

In anther embodiment of the present disclosure, a system for quench detection in superconductors comprises a REBCO (rare-earth barium copper oxide) superconducting tape architecture, which includes a substrate, a buffer layer stack residing on the substrate, where the buffer layer stack comprises one or more dielectric layers, and a first REBCO layer above the buffer layer stack, where the first REBCO layer is used for transporting current to form a transmission line with the substrate. The system further comprises a first device for exciting the REBCO superconducting tape architecture to form standing waves in the transmission line. The system additionally comprises the first device or a second device for detecting a quench in response to detecting a disturbance of the standing waves.

The foregoing has outlined rather generally the features and technical advantages of one or more embodiments of the present disclosure in order that the detailed description of the present disclosure that follows may be better understood. Additional features and advantages of the present disclosure will be described hereinafter which may form the subject of the claims of the present disclosure.

BRIEF DESCRIPTION OF THE DRAWINGS

A better understanding of the present disclosure can be obtained when the following detailed description is considered in conjunction with the following drawings, in which.

DETAILED DESCRIPTION

Figure 1:
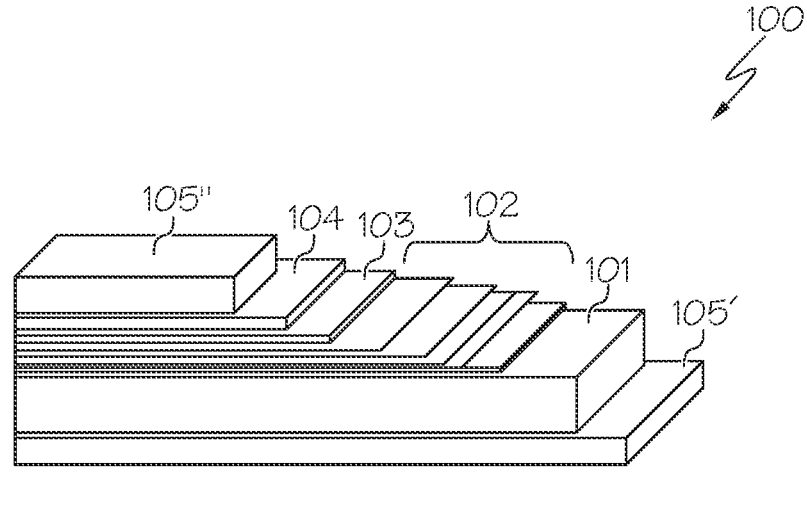
FIG. 1 illustrates an embodiment of the present disclosure of a schematic layout of a REBCO superconducting tape.

As stated in the Background section, the superior current densities of REBCO tapes enable high power density and highly-efficient electric machines. At such high current densities, the superconductor is susceptible to localized heating at defective spots ("hot spots") that are invariably present in a long tape. Since each tape turn of coils that includes a superconducting device is typically insulated, the hot spots do not dissipate easily which causes a thermal runaway (process that is accelerated by increased temperature, which in turn, releases energy that further increases temperature), leading to a catastrophic failure (termination of operation in the resistive normal state). Such localized heat deposition leading to thermal runaway may be referred to as "quench." That is, quench refers to the abnormal termination of operation that occurs during the transition of superconductors from a superconducting state to a resistive normal state. Hence, the quench or normal zone (i.e., the hot spot) needs to be detected rapidly to protect the superconducting device.

In particular, thermal runaway, which leads to catastrophic failure in HTS materials, such as REBCO, is caused by the normal zone propagation (NZP) velocity being low (e.g., 0.01-0.1 m/s). By having such a low NZP velocity, the normal zone slowly spreads and thus slowly increases a fault-induced voltage. Simultaneously, the slow spread of heat results in high temperatures before the voltage increases sufficiently for external detection. These two combined effects may result in thermal runaway and catastrophic failure of the coil before quench detection.

Currently, several methods are being developed for quench detection, including modifications to the HTS coil designs for quench tolerance. These include acoustic emission detection, acoustic thermometry, Rayleigh scattering-based fiber optics, various quench antennas, ultrasonic wave-based detection, varying laminations, no-insulation coils, different insulation materials and epoxies. However, each solution has drawbacks, such as susceptibility to vibrations, low signal-to-noise ratio, extrinsic sensors co-wound with the tape that increase the complexity of coil fabrication or a reduction in the overall current density.

As a result, there is not currently a means for rapid quench detection in high temperature superconductors, such as REBCO, before thermal runaway.

The embodiments of the present disclosure provide a means for rapid detection of quench in high temperature superconductors, such as REBCO, before thermal runaway, by utilizing the high temperature superconductor (e.g., REBCO) tape architecture as a transmission line at high frequencies for rapid quench detection as discussed herein.

While the following discusses utilizing the REBCO tape architecture as a transmission line at high frequencies for rapid quench detection, it is noted that the principles of the present disclosure are not to be limited in such a manner and that any high temperature superconductor tape architecture may be utilized as a transmission line at high frequencies for rapid quench detection. A person of ordinary skill in the art would be capable of applying the principles of the present disclosure to such implementations. Further, embodiments applying the principles of the present disclosure to such implementations would fall within the scope of the present disclosure.

In some embodiments of the present disclosure, the present disclosure comprises a method and system for quench detection in high temperature superconductors, such as REBCO, before thermal runaway. In one embodiment, a REBCO superconducting tape is excited as a transmission line forming standing waves. A quench may then be detected in response to detecting a disturbance of the standing waves. In this manner, the principles of the present disclosure provide a means for rapid detection of quench in high temperature superconductors, such as REBCO, before thermal runaway.

Referring now to the Figures in detail, FIG. 1 illustrates an embodiment of the present disclosure of a schematic layout of a REBCO superconducting tape 100.

As shown in FIG. 1, REBCO (rare-earth element barium copper oxide) superconducting tape 100 includes a substrate 101 of structural material (e.g., Hastelloy®, stainless steel or nickel alloys). In one embodiment, layers of metal oxides (buffer layer stack 102) and a superconducting REBCO layer 103 are deposited with a two dimensional texture upon substrate 101 by chemical or physical means. In one embodiment, a stabilizing silver (e.g., Ag cap layer 104) is deposited on superconducting REBCO layer 103. In one embodiment, tape 100 is copper stabilized with a surrounding copper layer (e.g., Cu stabilization layers 105', 105"). In one embodiment, copper stabilization layers 105', 105" are optional.

In one embodiment, the thickness of copper stabilization layer 105' is approximately 20 μm. In one embodiment, the thickness of substrate 101 is approximately 50 μm. In one embodiment, the thickness of buffer layer stack is less than 0.2 μm. In one embodiment, the thickness of REBCO layer 103 is approximately 1 μm. In one embodiment, the thickness of Ag cap layer 104 is approximately 2 μm. In one embodiment, the thickness of copper stabilization layer 105" is approximately 20 μm. In one embodiment, the entire thickness of REBCO superconducting tape 100 is less than 0.1 mm. In one embodiment, the entire thickness of REBCO superconducting tape 100 without copper stabilization layers 105', 105" is less than 0.06 mm.

In one embodiment, REBCO superconducting tape 100 is a high temperature superconducting tape which operatively behaves as a superconductor at a temperature above 77K. In one embodiment, REBCO superconducting tape 100 conducts electricity with zero electrical resistance.

As discussed above, the principles of the present disclosure provide a means for rapid quench detection in high temperature superconductors, such as REBCO, before thermal runaway. In one embodiment, quench may be rapidly detected in REBCO (e.g., REBCO layer 103) by utilizing the REBCO tape architecture (e.g., REBCO superconducting tape 100) as a transmission line at high frequencies for rapid quench detection as discussed below in connection with FIG. 2.

Figure 2:
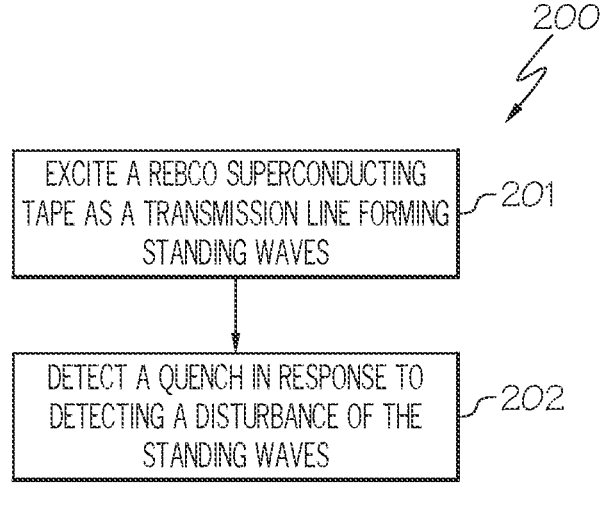
FIG. 2 is a flowchart of a method for rapid quench detection in high temperature superconductors in accordance with an embodiment of the present disclosure.

FIG. 2 is a flowchart of a method 200 for rapid quench detection in high temperature superconductors in accordance with an embodiment of the present disclosure.

Referring to FIG. 2, in conjunction with FIG. 1, in step 201, a REBCO superconducting tape, such as REBCO superconducting tape 100, is excited as a transmission line forming standing waves.

In one embodiment, tape 100 is treated as a microstrip-like transmission line where the transverse electromagnetic mode is excited. In one embodiment, such an excitation of tape 100 forms standing waves of a particular Q(quality)-factor, characteristic of the elements included in the circuit.

In step 202, a quench is detected in response to detecting a disturbance of the standing waves.

It is noted that transmission lines are sensitive to any change in uniformity along its length, either dimensional change or property change, such as a change in the dielectric constant of the dielectric layers or conductivity of the conducting layers. As the REBCO film (e.g., REBCO layer 103) is a nonlinear device at the transition between the superconducting state and the normal state, a large change in resistivity will occur if a quench occurs locally. Unlike voltage detection where the signal is proportional to the length of the normal zone, a 100 m long transmission line will effectively become two 50 m transmission lines if quench occurs midway along the tape, joined by a resistive transmission segment. The standing waves formed in the transmission line are immediately disturbed, which, in one embodiment, can be readily sensed by a frequency analyzer in sweep mode that acts as a source of excitation and a sensing circuit (used to detect disturbances of the standing waves). Hence, the disturbance of the standing waves results from a change in resistivity of REBCO superconducting tape 100. Furthermore, in one embodiment, dual mode can be achieved if two excitation circuits are connected at each end of tape 100 (or coil), or if tape 100 is used as a transmitter (so that the excitation is performed on one end, but the signal is sensed at both ends). Such a signal change will be sensed almost instantaneously.

In one embodiment, the disturbance of the standing waves is detected by detecting multiple reflections in a frequency sweep with standing waves occurring at multiples of the wavelengths of some characteristic length in the transmission line (e.g., length of the transmission line itself or length of a segment of the transmission line from one end to the quenched location).

In another embodiment, the disturbance of the standing waves is detected by detecting a change in the frequency of reflections, such as when a disturbance along the transmission line changes the characteristic length or introduces a new characteristic length.

In a further embodiment, the disturbance of the standing waves is detected by detecting a change in a quality factor, such as a change in the quality factor of the resonance peaks.

In one embodiment, the disturbance of the standing waves is detected by detecting a change in the quality factor if a part of the superconductor becomes a normal conductor (quench).

In a further embodiment, the disturbance of the standing waves is detected by detecting a change in the magnitude of a resonance peak.

It is noted that the disturbance of the standing waves may be detected using a combination of the embodiments discussed above.

Since the REBCO film, such as REBCO layer 103, and the metal substrate, such as substrate 101, are separated by a thin dielectric, such as a dielectric layer of buffer layer stack 102, REBCO superconducting tape 100 may be excited by an alternating current (AC) source which produces a signal that is a function of the total capacitance or the transmission line characteristics at high frequencies.

In one embodiment, high temperature superconductor (HTS) tape, such as REBCO superconducting tape 100, used in a transmission line mode is excited in a non-contact manner. For example, a capacitor plate in the vicinity of REBCO superconducting tape 100 introduces electromagnetic waves (EM) that will propagate along the entire length of REBCO superconducting tape 100 (e.g., the entire length of REBCO layer 103).

In another embodiment, REBCO superconducting tape 100 is excited with an inductive loop and again forms EM waves if the frequency and coupling are chosen appropriately.

In one embodiment, the arrangement of the capacitor and/or inductor excitation is modified to introduce different wave modes (e.g., transverse with different polarizations, longitudinal, etc.). These features provide great flexibility and multitude of choices for circuit optimization to form a quench detection system that is most sensitive to disturbances.

A discussion regarding the various embodiments of the quench detection system using method 200 is provided below. In particular, such embodiments utilize quench detection integrated within REBCO superconducting tape 100.

Figure 3A:
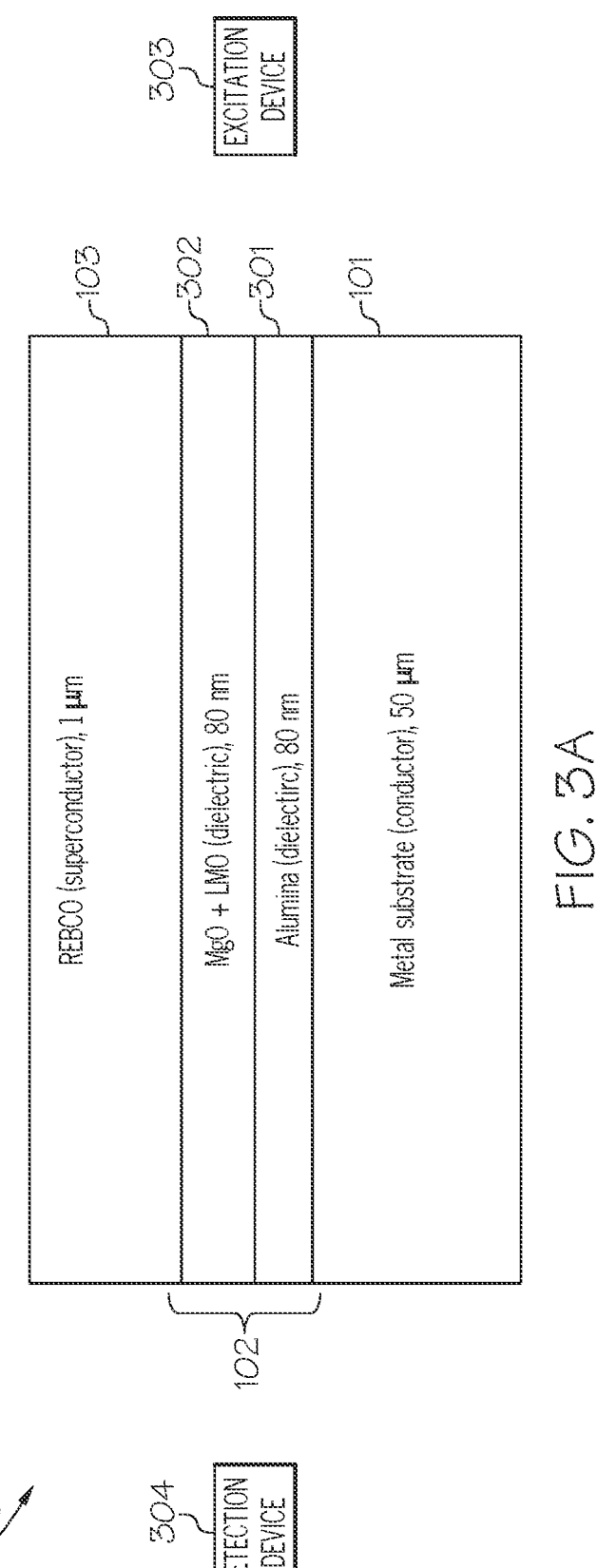
FIG. 3A illustrates a system for quench detection in the REBCO superconducting tape with an integrated transmission line in accordance with an embodiment of the present disclosure.

Referring now to FIG. 3A, FIG. 3A illustrates a system 300 for quench detection in the REBCO superconducting tape with an integrated transmission line in accordance with an embodiment of the present disclosure.

As shown in FIG. 3A, system 300 includes a substrate 101 which corresponds to a metal substrate (conductor) with a thickness of approximately 50 μm. Furthermore, as shown in FIG. 3A, system 300 includes a buffer layer stack 102 residing on substrate 101, where buffer layer stack 102 includes multiple dielectric layers, such as dielectric layer 301 (e.g., alumina) and dielectric layer 302 (e.g., magnesium oxide (MgO) and lanthanum manganate (LMO)). In one embodiment, the thickness of dielectric layer 301 is approximately 80 nm. In one embodiment, the thickness of dielectric layer 302 is approximately 80 nm.

Additionally, as shown in FIG. 3A, system 300 includes a REBCO layer 103 residing on buffer layer stack 102. In one embodiment, the thickness of REBCO layer 103 is approximately 1 μm.

Furthermore, as shown in FIG. 3A, system 300 includes an excitation device 303 configured to excite REBCO layer 103 as a transmission line forming standing waves. In one embodiment, excitation device 303 corresponds to an alternating current (AC) source with terminals between substrate 101 and REBCO layer 103. In one embodiment, the AC source produces a signal that is a function of transmission line characteristics.

In one embodiment, excitation device 303 excites REBCO layer 103 in a non-contact matter. In such an embodiment, excitation device 303 corresponds to a capacitor plate or an inductor loop. Furthermore, in such an embodiment, such excitation introduces electromagnetic waves propagating along REBCO superconducting tape 100, such as REBCO layer 103.

Additionally, as shown in FIG. 3A, system 300 includes a detection device 304 that is configured to detect a quench in response to detecting a disturbance of the standing waves.

In one embodiment, excitation device 303 and detection device 304 are the same device, such as a frequency analyzer, in which the frequency analyzer in a sweep mode functions as both a source of excitation and a sensing circuit for detecting a disturbance of the standing waves.

In one embodiment, detection device 304 detects the disturbance of the standing waves via one or more of the following means as previously discussed: detecting multiple reflections in a frequency sweep, detecting a change in a frequency of reflections, detecting a change in a quality factor and detecting a change in a magnitude of a resonance peak.

Furthermore, detection device 304 is configured to detect the disturbance of the standing waves via one or more of the following techniques.

For instance, in one embodiment, detection device 304 detects the disturbance of the standing waves using capacitance measurements. For example, as a section of a superconducting coil quenches, the capacitance of HTS tape, such as tape 100, changes from a superconducting capacitor of length L to two segments of length $(1-f)L-s/2$ and $fL+s/2$, joined by a normal capacitor of length s, where f indicates the location of the quench. Both the amplitude and phase of an AC signal are affected.

In one embodiment, detection device 304 detects the disturbance of the standing waves using a single-ended radio frequency sweep using contact coupling. For example, with single-ended sweeps, the transmission line study of RF/microwave resonances in the tape structures, such as tape structure 100, will be using contact or capacitive coupling implemented on top of such a finite-length transmission line. Furthermore, with single-ended sweeps, the Q-factor and resonant frequency values of generated resonances in reflection (s11) mode are monitored.

In one embodiment, detection device 304 detects the disturbance of the standing waves using a double-ended radio frequency (RF) sweep. For example, double-ended RF sweeps offer the potential advantage of obtaining both reflection (s11) and transmission (s12) signals and superimposing them as a function of time. As such, the reflections and transmissions are correlated by the location and size of the quenched section of the coil. Phase shifts and Q-factors are also correlated, which provides increased spatial resolution of the quenched area. Furthermore, more detailed information about the nature of the disturbances is obtained as the correlation between the detected modes provides additional level of information not available in single-ended mode.

In one embodiment, detection device 304 detects the disturbance of the standing waves using intermodulation detection. For example, the HTS tape, such as YBCO tape, is driven with a signal containing two frequencies $f_1$ and $f_2$ to detect the presence of nonlinearities—intermodulation distortion (IMD) peaks—in the output signal. In such an embodiment, the YBCO tape acts as an RCL resonator. In one embodiment, such frequencies are generated by a two-tone generator.

Typically, in the case of nonlinearity, an IMD spectrum contains many higher order peaks; to conserve bandwidth, however, in one embodiment, only the fundamental ($f_1$ and $f_2$) and third-order IMD peaks ($2f_1-f_2$ and $2f_2-f_1$) are measured as a function of the input power, such as via a spectrum analyzer.

Furthermore, an additional advantage of the IMD technique, related to its sensitivity, is its capability of probing nonlinearities at very low power levels, which allows avoidance of any thermal effects.

Referring again to FIG. 3A, REBCO layer 103 is used for transporting current (such a REBCO layer is referred to herein as "T-REBCO") which forms a transmission line with substrate 101. In one embodiment, a high frequency signal of small magnitude is superimposed on the transport current through T-REBCO 103. Since the transmission line is very sensitive to only the high frequency signal, an effective sensing circuit is formed. Unlike voltage detection methods where the signal during quench is proportional to the normal zone length (which is small in REBCO), a 100 m long transmission line will effectively become two 50 m lines if quench occurs midway along the tape. The standing waves formed in the transmission line are immediately disturbed, which can be readily sensed by detection device 304 as changes in the frequency of the reflections and changes in the Q-factor of the resonance peaks.

Figure 3B:
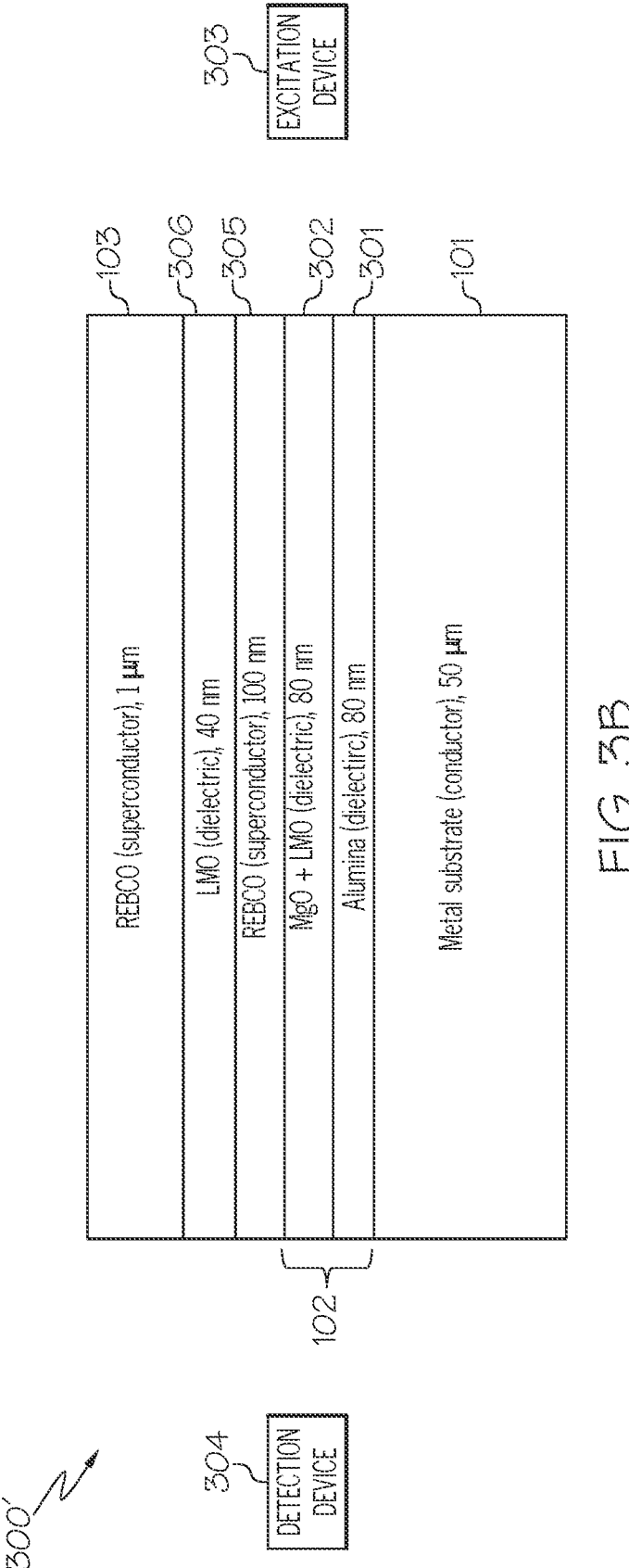
FIG. 3B illustrates an alternative system for quench detection in the REBCO superconducting tape with an integrated transmission line in accordance with an embodiment of the present disclosure.

Referring now to FIG. 3B, FIG. 3B illustrates an alternative system 300' for quench detection in the REBCO superconducting tape with an integrated transmission line in accordance with an embodiment of the present disclosure.

As shown in FIG. 3B, system 300' differs from system 300 in that a second REBCO layer 305 resides on buffer layer stack 102. In one embodiment, REBCO layer 305 has a thickness of approximately 100 nm. In one embodiment, REBCO layer 305 has a thickness between 10-100 nm. Such a layer is referred to herein as the "S-REBCO," which is used exclusively for sensing as part of a transmission line. In one embodiment, the S-REBCO layer 305 is electrically floating with respect to all other layers and can be separately excited to serve as a sensing circuit.

Furthermore, as shown in FIG. 3B, system 300' includes a dielectric layer 306 (e.g., LMO) residing on REBCO layer 305. In one embodiment, the thickness of dielectric layer 306 is approximately 40 nm.

Additionally, as shown in FIG. 3B, system 300' includes REBCO layer 103 residing on dielectric layer 306.

In one embodiment, excitation device 303 corresponds to multiple AC sources, such as, for example, a first AC source with terminals connected between substrate 101 and REBCO layer 305 and a second AC source with terminals connected between REBCO layer 305 and REBCO layer 103.

Figure 3C:
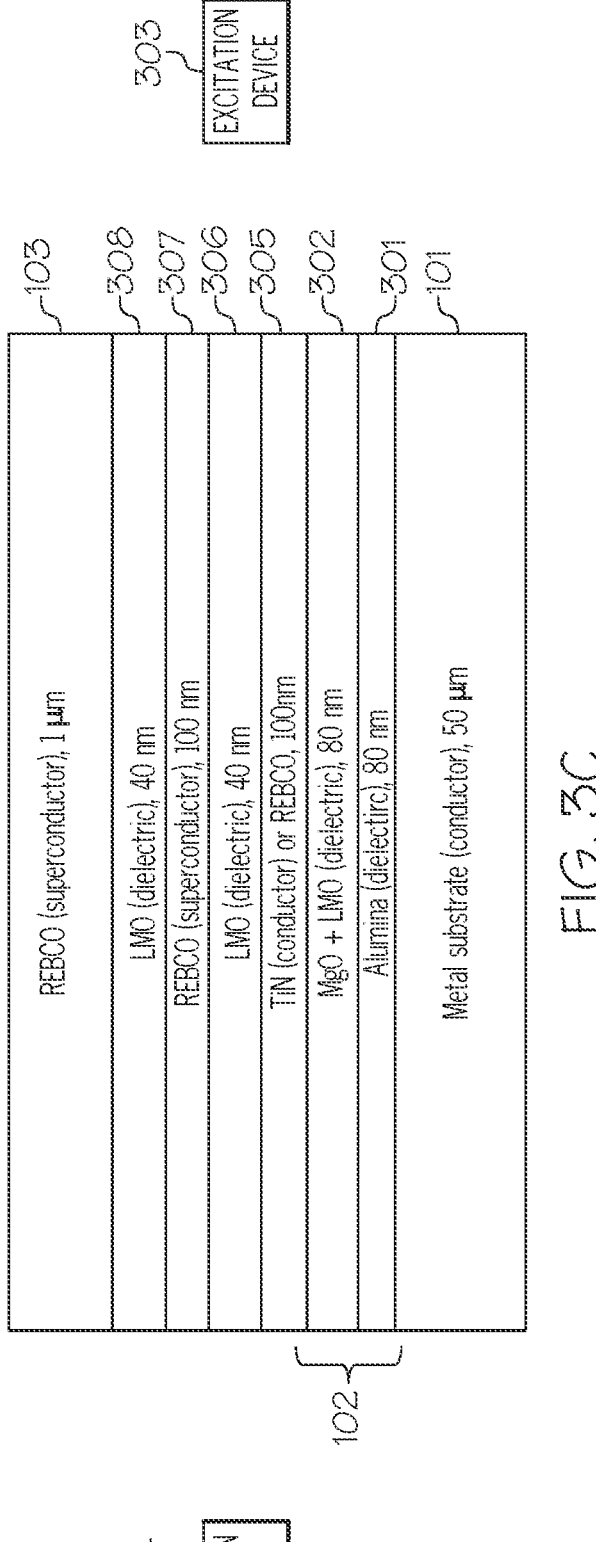
FIG. 3C illustrates a further alternative system for quench detection in the REBCO superconducting tape with an integrated transmission line in accordance with an embodiment of the present disclosure.

Referring now to FIG. 3C, FIG. 3C illustrates a further alternative system 300" for quench detection in the REBCO superconducting tape with an integrated transmission line in accordance with an embodiment of the present disclosure.

As shown in FIG. 3C, system 300" differs from system 300' in that a third REBCO layer 307 resides on dielectric layer 306. In one embodiment, REBCO layer 307 has a thickness of approximately 100 nm. In one embodiment, REBCO layer 307 has a thickness between 10-100 nm. In one embodiment, REBCO layer 307 corresponds to a "S-REBCO" layer.

Furthermore, in one embodiment, REBCO layer 305 has a thickness of approximately 100 nm. In one embodiment, REBCO layer 305 has a thickness between 10-100 nm. In one embodiment, REBCO layer 305 corresponds to a "S-REBCO" layer. Alternatively, in another embodiment, REBCO layer 305 corresponds to a S-normal conductor (e.g., TiN).

Furthermore, as shown in FIG. 3C, system 300" includes a dielectric layer 308 (e.g., LMO) residing on REBCO layer 307. In one embodiment, the thickness of dielectric layer 308 is approximately 40 nm.

Additionally, as shown in FIG. 3C, system 300" includes REBCO layer 103 residing on dielectric layer 308.

In one embodiment, system 300" includes two floating layers (layers 305, 307) that are grown for the sensing/transmission line (e.g., S-REBCO/S-REBCO or S-REBCO/S-normal conductor). In one embodiment, the multitude of couplings will form characteristic peaks of different Q factors in a frequency sweep. During quench, new reflections will form and existing reflections will change in frequency, Q-factor and intensity. The heat spread from the quench in the T-REBCO film (layer 103) to the S-REBCO film (layer 307) will be almost instantaneous, and will cause the S-REBCO layer (layer 307) to readily transition to a normal state and form a signal change in the transmission line.

It is noted that sensing layers 305, 307 form an independent, floating circuit with respect to transport REBCO layer 103. As such, the sensing circuit is completely isolated/floating, and forms a very high Q line.

As a result of the foregoing, embodiments of the present disclosure provide a means for detecting quench rapidly in high temperature superconductors (HTS) by utilizing the HTS tape architecture itself as a transmission line at high frequencies. For example, in one embodiment, the HTS tape is treated as a microstrip-like transmission line wherein a transverse electromagnetic mode is excited forming standing waves which are immune to noise. A quench may be rapidly detected in response to detecting a disturbance in such standing waves.

For example, even in the case of a 10 km long REBCO tape in a coil, with unrealistically high permittivity of the dielectric layer (e.g., 500 F/m), the signal propagation velocity in the transmission line could be 10,000 km/s which yields a quench response time of 0.5 ms. In another example, using the principles of the present disclosure, a quenched zone size of 10 cm is detected over a 1 km tape length with no noise interference to the measured signal. As a result, the principles of the present disclosure provide a rapid quench detection system.

Furthermore, by utilizing such embodiments, significant modification to the HTS coil construction is avoided. For example, co-winding additional sensors is avoided for quench detection. In another example, the design of the coils does not need to be modified to address insulation, stability, effective current density or lateral heat transfer.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for quench detection in superconductors, the method comprising:

exciting a REBCO (rare-earth barium copper oxide) superconducting tape as a transmission line forming standing waves; and detecting a quench in response to detecting a disturbance of said standing waves.

2. The method as recited in claim 1, wherein said disturbance of said standing waves results from a change in resistivity of said REBCO superconducting tape.

3. The method as recited in claim 1, wherein said disturbance of said standing waves is detected via one or more of the following: detecting multiple reflections in a frequency sweep, detecting a change in a frequency of reflections, detecting a change in a quality factor, and detecting a change in a magnitude of a resonance peak.

4. The method as recited in claim 1, wherein said disturbance of said standing waves is detected via one or more of the following techniques: capacitance measurements, a single-ended radio frequency sweep using contact coupling, a single-ended radio frequency sweep using capacitive coupling, a single-ended radio frequency sweep using inductive coupling, a double-ended radio frequency sweep and intermodulation detection.

5. The method as recited in claim 1, wherein said standing waves are formed of a particular quality factor.

6. The method as recited in claim 1, wherein said REBCO superconducting tape is a high temperature superconducting tape which operatively behaves as a superconductor at a temperature above 77K.

7. The method as recited in claim 1, wherein said disturbance of said standing waves is detected by a frequency analyzer in a sweep mode which functions as both a source of excitation and a sensing circuit.

8. The method as recited in claim 1, wherein said excitation is performed by an alternating current source.

9. The method as recited in claim 8, wherein said alternating current source produces a signal that is a function of transmission line characteristics.

10. The method as recited in claim 1, wherein said REBCO superconducting tape is excited in a non-contact manner.

11. The method as recited in claim 1, wherein said excitation is performed via a capacitor plate or an inductive loop.

12. The method as recited in claim 1, wherein said excitation introduces electromagnetic waves propagating along said REBCO superconducting tape.

13. A system for quench detection in superconductors, the system comprising:

a REBCO (rare-earth barium copper oxide) superconducting tape architecture, comprising:

a substrate;

a buffer layer stack residing on said substrate, wherein said buffer layer stack comprises one or more dielectric layers; and a first REBCO layer above said buffer layer stack, wherein said first REBCO layer is used for transporting current to form a transmission line with said substrate; and a first device for exciting said REBCO superconducting tape architecture to form standing waves in said transmission line; and said first device or a second device for detecting a quench in response to detecting a disturbance of said standing waves.

14. The system as recited in claim 13, wherein said REBCO superconducting tape architecture further comprises:

a second REBCO layer residing on said buffer layer stack;

a first dielectric layer residing on said second REBCO layer; and said first REBCO layer residing on said first dielectric layer.

15. The system as recited in claim 14, wherein said second REBCO layer is used for sensing as part of said transmission line.

16. The system as recited in claim 14, wherein said second REBCO layer is electrically floating with respect to other layers of said REBCO superconducting tape architecture.

17. The system as recited in claim 13, wherein said REBCO superconducting tape architecture further comprises:

a second REBCO layer residing on said buffer layer stack;

a first dielectric layer residing on said second REBCO layer;

a third REBCO layer residing on said first dielectric layer;

a second dielectric layer residing on said third REBCO layer; and said first REBCO layer residing on said second dielectric layer.

18. The system as recited in claim 17, wherein said second and third REBCO layers comprise two sensing layers which form an independent, floating circuit with respect to said first REBCO layer.

19. The system as recited in claim 13, wherein said disturbance of said standing waves results from a change in resistivity of said REBCO superconducting tape architecture.

20. The system as recited in claim 13, wherein said first device or said second device detects said disturbance of said standing waves via one or more of the following: detecting multiple reflections in a frequency sweep, detecting a change in a frequency of reflections, detecting a change in a quality factor, and detecting a change in a magnitude of a resonance peak.

21. The system as recited in claim 13, wherein said first device or said second device detects said disturbance of said standing waves via one or more of the following techniques: capacitance measurements, a single-ended radio frequency sweep using contact coupling, a single-ended radio frequency sweep using capacitive coupling, a single-ended radio frequency sweep using inductive coupling, a double-ended radio frequency sweep and intermodulation detection.

22. The system as recited in claim 13, wherein said standing waves are formed of a particular quality factor.

23. The system as recited in claim 13, wherein said first device comprises a frequency analyzer configured to both excite said REBCO superconducting tape architecture and detect said disturbance of said standing waves.

24. The system as recited in claim 13, wherein said first device comprises an alternating current source configured to excite said REBCO superconducting tape architecture.

25. The system as recited in claim 24, wherein said alternating current source produces a signal that is a function of transmission line characteristics.

26. The system as recited in claim 13, wherein said first device excites said REBCO superconducting tape architecture in a non-contact manner.

27. The system as recited in claim 13, wherein said first device excites said REBCO superconducting tape architecture via a capacitor plate or an inductive loop.

28. The system as recited in claim 27, wherein said excitation introduces electromagnetic waves propagating along said first REBCO layer.

* * * * *